(12) United States Patent
Wakiyama et al.

(10) Patent No.: US 9,105,625 B2
(45) Date of Patent: Aug. 11, 2015

(54) SEMICONDUCTOR APPARATUS, METHOD OF MANUFACTURING SEMICONDUCTOR APPARATUS, AND ELECTRONIC APPARATUS

(75) Inventors: Satoru Wakiyama, Kanagawa (JP); Hiroshi Ozaki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 102 days.

(21) Appl. No.: 13/568,574

(22) Filed: Aug. 7, 2012

(65) Prior Publication Data

US 2013/0043585 A1 Feb. 21, 2013

(30) Foreign Application Priority Data

Aug. 17, 2011 (JP) .................... 2011-178390

(51) Int. Cl.
*H01L 23/48* (2006.01)
*H01L 23/498* (2006.01)
*H01L 27/146* (2006.01)
*H01L 23/00* (2006.01)
*H01L 21/56* (2006.01)

(52) U.S. Cl.
CPC .......... *H01L 23/49816* (2013.01); *H01L 24/11* (2013.01); *H01L 24/13* (2013.01); *H01L 24/16* (2013.01); *H01L 27/14618* (2013.01); *H01L 21/563* (2013.01); *H01L 27/14683* (2013.01); *H01L 2224/0401* (2013.01); *H01L 2224/05567* (2013.01); *H01L 2224/1134* (2013.01); *H01L 2224/11416* (2013.01); *H01L 2224/11436* (2013.01); *H01L 2224/11825* (2013.01); *H01L 2224/13019* (2013.01); *H01L 2224/1319* (2013.01); *H01L 2224/1357* (2013.01); *H01L 2224/13076* (2013.01); *H01L 2224/13147* (2013.01); *H01L 2224/13562* (2013.01); *H01L 2224/13655* (2013.01); *H01L 2224/16238* (2013.01); *H01L 2224/16503* (2013.01); *H01L 2224/2919* (2013.01); *H01L 2224/73104* (2013.01); *H01L 2224/73204* (2013.01); *H01L 2224/8181* (2013.01); *H01L 2224/81193* (2013.01); *H01L 2224/81355* (2013.01); *H01L 2224/81411* (2013.01); *H01L 2224/81413* (2013.01); *H01L 2224/81815* (2013.01); *H01L 2224/81951* (2013.01); *H01L 2224/83104* (2013.01); *H01L 2224/83191* (2013.01); *H01L 2224/83862* (2013.01); *H01L 2224/94* (2013.01);

(Continued)

(58) Field of Classification Search
CPC ............ H01L 21/768; H01L 21/76816; H01L 21/76838; H01L 21/28026; H01L 21/823475; H01L 21/823871; H01L 23/552; H01L 25/16; H01L 27/14636; H01L 2224/19; H01L 2224/25; H01L 2225/06541
USPC .................................. 257/737, 738, 678–733
See application file for complete search history.

(56) References Cited

U.S. PATENT DOCUMENTS

2007/0152331 A1* 7/2007 Kang et al. ..................... 257/737
2009/0085216 A1* 4/2009 Tanaka et al. .................. 257/772

(Continued)

FOREIGN PATENT DOCUMENTS

JP 2001-60602 3/2001
JP 2005-179099 7/2005

(Continued)

*Primary Examiner* — Selim Ahmed
*Assistant Examiner* — Moin Rahman
(74) *Attorney, Agent, or Firm* — Hazuki International, LLC

(57) ABSTRACT

A semiconductor apparatus, including: a semiconductor component; a Cu stud bump that is formed on the semiconductor component; and a solder bump configured to electrically connect to the Cu stud bump.

5 Claims, 12 Drawing Sheets

(52) U.S. Cl.
CPC ............... *H01L 2924/00014* (2013.01); *H01L 2924/15321* (2013.01)

(56) References Cited

U.S. PATENT DOCUMENTS

2009/0278967 A1* 11/2009 Toumiya ................. 348/294
2011/0084387 A1* 4/2011 Dubin et al. ............. 257/737
2011/0101523 A1* 5/2011 Hwang et al. ........... 257/737

FOREIGN PATENT DOCUMENTS

| JP | 2009-218442 | 9/2009 |
| JP | 2009-239278 | 10/2009 |
| JP | 2011-23568 | 2/2011 |

* cited by examiner

SEMICONDUCTOR APPARATUS, METHOD OF MANUFACTURING SEMICONDUCTOR APPARATUS, AND ELECTRONIC APPARATUS

BACKGROUND

The present disclosure relates to a semiconductor apparatus, a method of manufacturing the semiconductor apparatus, and an electronic apparatus that are configured to be connected using a stud bump.

As a flip-chip connection technique of a semiconductor apparatus, there is a method of connecting an Au stud bump to an SnAg solder bump or a method of connecting an Au stud bump to an Sn solder bump which is coated with Pd (Japanese Patent Application Laid-Open Nos. 2009-218442 and 2009-239278).

There is a flip-chip connection technique for connecting an Au stud bump to a Cu electrode of a semiconductor chip (Japanese Patent Application Laid-Open No. 2001-60602) or a flip-chip connection technique for connecting an Au stud bump to an Sn-plated Cu electrode (Japanese Patent Application Laid-Open No. 2005-179099).

Moreover, a Cu stud bump substituted for an Au stud bump has been suggested (Japanese Patent Application Laid-Open No. 2011-23568).

SUMMARY

In the flip-chip connection technique using the above described stud bump, it has been demanded to improve connection reliability of a semiconductor apparatus.

The present disclosure provides a semiconductor apparatus, a method of manufacturing the semiconductor apparatus, and an electronic apparatus which have high connection reliability.

The semiconductor apparatus in the present disclosure includes a semiconductor component, a Cu stud bump formed on the semiconductor component, and a solder bump electrically connected to the Cu stud bump.

Moreover, the method of manufacturing the semiconductor apparatus in the present disclosure includes forming the Cu stud bump on the semiconductor component and flip-chip connecting the Cu stud bump to the solder bump.

Moreover, the electronic apparatus in the present disclosure includes the semiconductor apparatus and a signal processing circuit configured to process an output signal of the semiconductor apparatus.

According to the semiconductor apparatus and the method of manufacturing the semiconductor apparatus, the flip-chip connection is performed using the Cu stud bump, so that an alloy having a low strength is not generated at a connection portion between Cu and a solder even in low temperature connection. Therefore, connection defects are prevented at the connection portion between the Cu stud bump and the solder bump, and the connection reliability can be improved.

According to the present disclosure, it is possible to provide the semiconductor apparatus and the electronic apparatus which have high connection reliability.

These and other objects, features and advantages of the present disclosure will become more apparent in light of the following detailed description of best mode embodiments thereof, as illustrated in the accompanying drawings.

DETAILED DESCRIPTION OF EMBODIMENTS

Figure 1A:
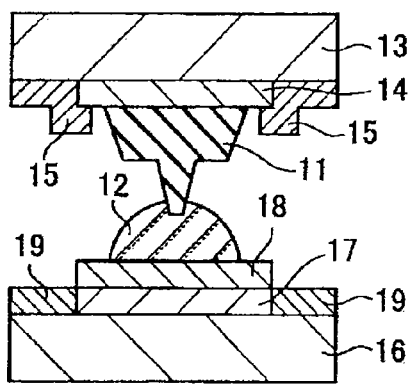
FIG. 1A is a drawing showing a configuration of a stud bump and a solder bump prior to flip-chip connection.

Hereinafter, examples of embodiments for carrying out the present disclosure will be described. However, the present disclosure will not be limited to the following examples.

It is noted that the descriptions will be given below in accordance with the following order.

1. Overview of semiconductor apparatus
2. First embodiment of semiconductor apparatus
3. Method of manufacturing semiconductor apparatus of first embodiment
4. Second embodiment of semiconductor apparatus
5. Method of manufacturing semiconductor apparatus of second embodiment
6. Electronic apparatus 1. Overview of Semiconductor Apparatus An overview of flip-chip connection of a semiconductor apparatus will be described.

Figure 1B:
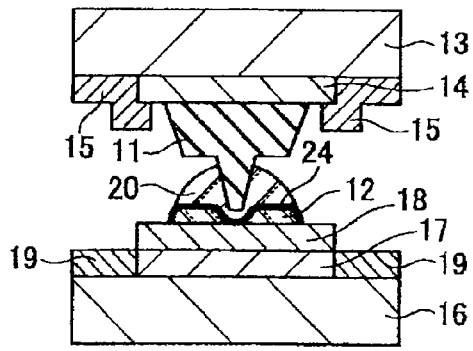
FIG. 1B is a drawing showing a configuration of the stud bump and the solder bump after the flip-chip connection.

FIG. 1 show configurations of flip-chip connection using a general Au stud bump of related art. FIG. 1A is a drawing showing a configuration of an Au stud bump 11 and an Sn bump 12 prior to connection. FIG. 1B is a drawing showing a configuration of the Au stud bump 11 and the Sn bump 12 after the connection.

The Au stud bump 11 shown in FIG. 1A is the Au bump formed of Au wires. The Au stud bump 11 is formed on an electrode 14 which is formed on a semiconductor component 13. The semiconductor component 13 is coated by a protective layer 15 except on the electrode 14 on which the Au stud bump 11 is formed.

Moreover, the Sn bump 12 shown in FIG. 1A includes an Sn group solder such as an SnAg solder bump. The Sn bump 12 includes an electrode 17 formed on a wiring substrate 16 and an under bump metal (UBM) 18 formed on the electrode 17. The wiring substrate 16 is coated by a protective layer 19 except on the electrode 17 on which the UBM 18 is formed.

As shown in FIG. 1B, the semiconductor component 13 is flip-chip connected on the wiring substrate 16 by the Au stud bump 11 and the Sn bump 12.

At this time, it may be necessary to connect the Au stud bump 11 and the Sn bump 12 at 300° C. or higher to improve the connection reliability.

As shown in FIG. 1B, in the connection at 300° C. or lower, an intermetallic compound (IMC) 20 having a low strength such as $SnAu_4$ alloy is generated at a connection portion due to diffusion of Au to Sn. Therefore, generation of a crack 24 and the like may decrease in connectivity and reliability. Moreover, since the Au stud bump 11 is stuck into the Sn bump 12, it is difficult to prevent the diffusion of Au to Sn. Therefore, it is difficult to prevent the generation of the IMC 20 at the connection portion.

As described above, in the flip-chip connection performed by the Au stud bump 11 and the Sn bump 12, it may be necessary to perform high-temperature connection at 300° C. or higher, so that it is difficult to perform low-temperature connection in view of the connection reliability.

Figure 2A:
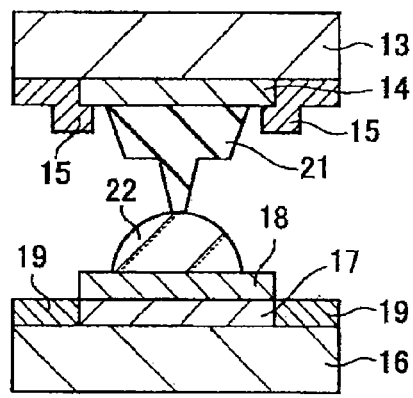
FIG. 2A is another drawing showing a configuration of the stud bump and the solder bump prior to the flip-chip connection.
Figure 2B:
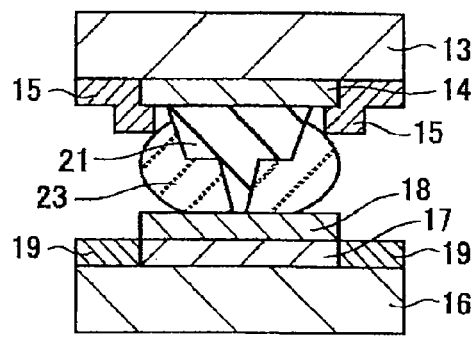
FIG. 2B is another drawing showing a configuration of the stud bump and the solder bump after the flip-chip connection.

Moreover, instead of using the Sn bump, as shown in FIG. 2, it is considered that a low melting point solder bump of In group is used to flip-chip connect the Au stud bump 11. FIG. 2A is a drawing showing a configuration of an Au stud bump 21 and an In bump 22 prior to connection. FIG. 2B is a drawing showing a configuration of the Au stud bump 21 and the In bump 22 after the connection.

The Au stud bump 21 shown in FIG. 2A has the same configuration as FIG. 1A described above. Moreover, the In bump is constituted of an In group solder. In this method, an alloy having a low strength such as $SnAu_4$ alloy is not generated, so that it is possible to perform low-temperature flip-chip connection at 200° C. or lower.

However, in the connection performed by using the Au stud bump 21 and the In bump 22, a diffusion coefficient between Au and In is large, so that it is difficult to control a growth of an AuIn alloy. As a result, as shown in FIG. 2B, the In bump is sucked due to a growth of an AuIn alloy 23. Therefore, in the flip-chip connection performed by the Au stud bump 21 and the In bump 22, it is difficult to secure the connectivity.

As described above, in the flip-chip connection using the stud bump, it is difficult to perform low temperature processing in view of the connection reliability. Therefore, in a case where a material having a low heat resistance is mounted on the semiconductor component and the like, it is difficult to apply the flip-chip connection having high connection reliability. Therefore, it has been demanded that a method of the flip-chip connection can stably connect, at a low temperature, the semiconductor apparatus and the like formed by using a material having a low heat resistance and have high connection reliability.

2. First Embodiment of Semiconductor Apparatus
[Image Sensor: Configuration]

Figure 3:
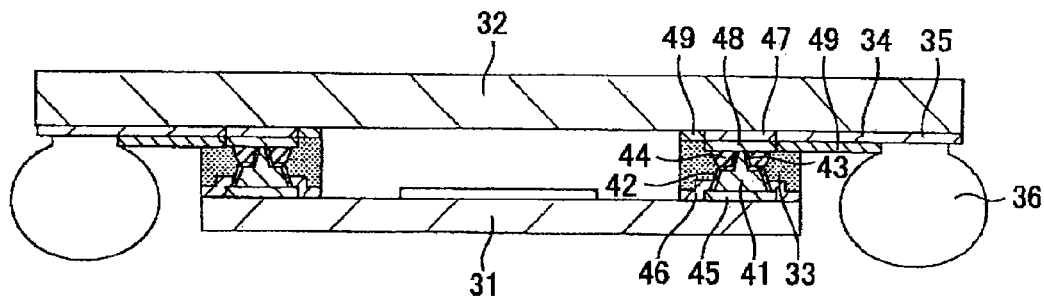
FIG. 3 is a cross-sectional view showing a configuration of a semiconductor apparatus according to a first embodiment.

Hereinafter, a first embodiment of the semiconductor apparatus will be described. FIG. 3 is a cross-sectional view showing a configuration of the semiconductor apparatus according to the first embodiment. In the first embodiment, the description will be made taking an example of an image sensor as the semiconductor apparatus. FIG. 3 is a cross-sectional view of a semiconductor apparatus 30 formed of the image sensor mounted on a glass substrate.

The semiconductor apparatus 30 is constituted of a semiconductor component 31 including the image sensor, and a glass substrate 32. The semiconductor component 31 includes an electrode 45 formed on the semiconductor component 31 and a Cu stud bump 41 formed on the electrode 45.

Moreover, the glass substrate 32 includes an electrode 47 for flip-chip connection formed on the glass substrate 32, the under bump metal (UBM) 48 formed on the electrode 47, and a low melting point solder bump 44 formed on the UBM 48. Further, a wiring layer 34 formed on the glass substrate 32, a protective layer 49 coating the wiring layer 34, an electrode 35 for external connection connected to the wiring layer 34, and a solder ball 36 formed on the electrode 35 for external connection.

Moreover, an under-fill resin 33 which seals a connection portion between the Cu stud bump 41 and the solder bump 44 is provided between the semiconductor component 31 and the glass substrate 32.

The semiconductor component 31 is an element generally used as an image sensor and is a semiconductor element such as a CCD (charge coupled device) image sensor and a CMOS (complementary metal oxide semiconductor) image sensor. The semiconductor component 31 is disposed so as to face a light receiving surface to the glass substrate 32 side.

Moreover, the electrode 45 connected to the glass substrate 32 on the same surface as the light receiving surface is formed on the semiconductor component 31. Then, the Cu stud bump 41 for flip-chip connection is formed on the electrode 45. An alloy layer 43 is formed on a contact surface between the Cu stud bump 41 and the solder bump 44. Moreover, the Cu stud bump 41 includes a plating layer 42 on a surface which is not brought into contact with the solder bump 44.

The glass substrate 32 is constituted of a cover glass used for the image sensor, for example. Then, the electrode 47 for flip-chip connection and the electrode 35 for external connection are connected on the glass substrate 32 by the wiring layer 34. The solder ball 36 for connection to external devices is formed on the electrode 35. The solder ball 36 is used for a binary or ternary solder of Sn group and the like. For example, SnBi, SnIn, SnAgCu, SnZn, and SnAg and the like are used. It is noted that the glass substrate 32 may be connected by wire bonding using Au wires instead of the solder ball 36.

[Cu Stud Bump: Configuration]

Figure 4:
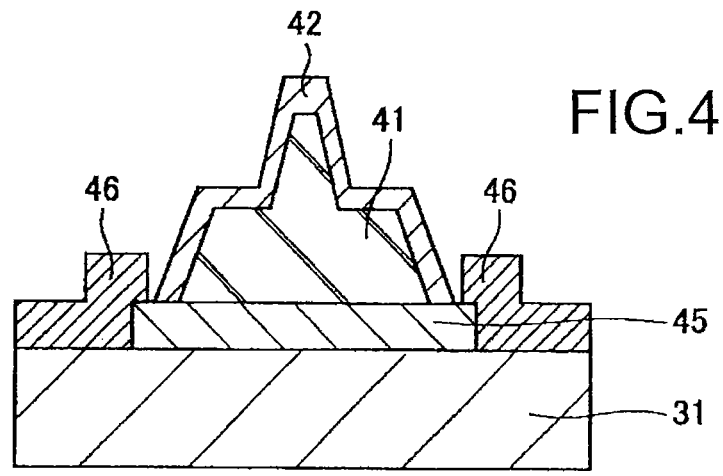
FIG. 4 is a drawing showing a configuration of a Cu stud bump prior to the flip-chip connection.
Figure 5:
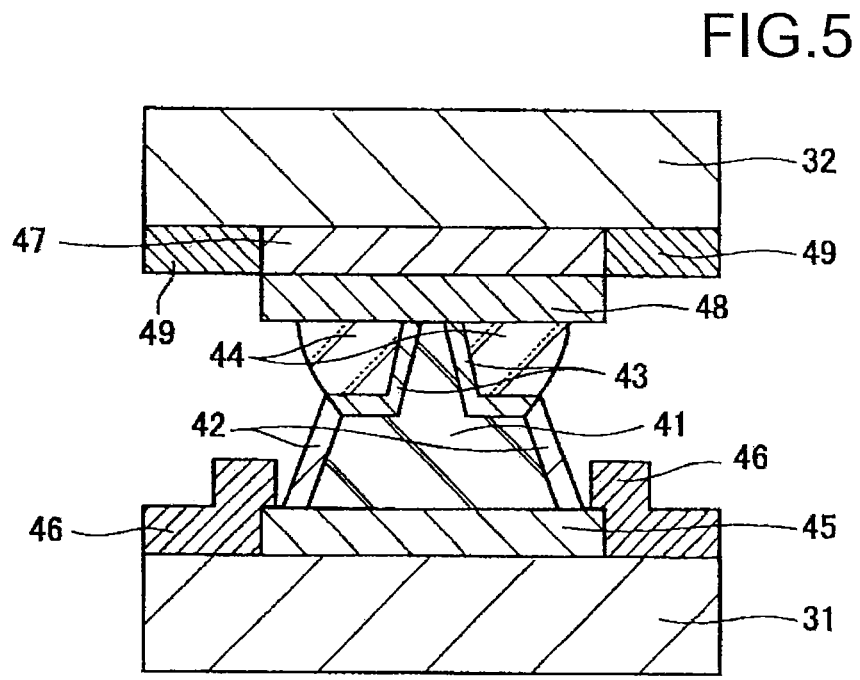
FIG. 5 is a drawing showing a configuration of the Cu stud bump and the solder bump after the flip-chip connection.

Next, in the above described semiconductor apparatus 30, FIG. 4 shows a configuration of the Cu stud bump 41 formed on the semiconductor component 31. The Cu stud bump 41 shown in FIG. 4 is a state prior to connection. Moreover, FIG. 5 shows a configuration of the Cu stud bump 41 and the solder bump 44 after connecting the semiconductor component 31 and the glass substrate 32.

As shown in FIG. 4, the Cu stud bump 41 is formed on the electrode 45 on the semiconductor component 31. The semiconductor component 31 is coated by a protective layer 46 except on the electrode 45 on which the Cu stud bump 41 is formed.

Moreover, a surface of the Cu stud bump 41 is coated by the plating layer 42.

The plating layer 42 is a protective layer for preventing oxidation of the Cu stud bump 41. Moreover, when the Cu stud bump 41 is flip-chip connected, the plating layer 42 is formed of a material which quickly diffuses the plating layer of the surface in the solder bump 44.

As the plating layer 42, for example, a plating layer constituted of a flash Ni plating layer and a flash Au plating layer by an electroless method, or an electroless Co plating layer is used.

Thicknesses of the plating layer 42 are formed at 0.01 to 0.1 μm, for example.

Moreover, the solder bump 44 provided on the glass substrate 32 is formed of a low melting point solder. As the low melting point solder, for example, a unary solder material of In, a low melting point binary solder material such as Sn—Bi, Sn—In, Bi—In, and a solder material formed by adding other metals to the binary solder material are used. As the low melting point solder, for example, a solder material whose melting point is 200° C. or lower is used.

Then, the Cu stud bump 41 formed on the semiconductor component 31 is brought into pressing contact with the solder bump 44 of the glass substrate 32, thereby entering a top end of the Cu stud bump 41 into the solder bump 44. Subsequently, heating is performed in a state where the Cu stud bump 41 is stuck into the solder bump 44, so that the flip-chip connection is performed as shown in FIG. 5.

As shown in FIG. 5, when the flip-chip connection is performed, the plating layer 42 of the contact surface between the Cu stud bump 41 and the solder bump 44 is diffused into the solder bump 44. Moreover, the alloy layer 43 of Cu and the solder is formed on the contact surface between the Cu stud bump 41 and the solder bump 44. At this time, it is suitable that the solder bump 44 is not entirely alloyed and the solder bump 44 which is not alloyed is left on the UBM 48.

In the above-described configuration, it is possible to prevent generation of alloy having a weak mechanical strength on an interface of the low melting point solder bump 44 by using Cu as the stud bump material of the flip-chip connection. Moreover, it is possible to perform the flip-chip connection at a low temperature by using the low melting point solder as the solder bump 44.

For example, in a case where the solder bump 44 is constituted of In, an intermetallic compound of $In_3Cu_7$ and the like are formed on an interface between the Cu stud bump 41 and the solder bump 44. The intermetallic compound of $In_3Cu_7$ has enough mechanical strength. Therefore, even in the low-temperature flip-chip connection, an alloy having a low strength which causes reduction in connection reliability is not generated. Moreover, even in a combination of the Cu stud bump and the low melting point binary solder material and the like, an alloy layer having a weak mechanical strength is not generated on the interface. Therefore, even in the semiconductor component 31 having heat sensitive configuration, it is possible to apply the flip-chip connection.

Therefore, in the flip-chip connection, it is possible to perform low-temperature connection and further improve the connection reliability of the semiconductor apparatus.

3. Method of Manufacturing Semiconductor Apparatus of First Embodiment

A method of manufacturing the semiconductor apparatus of the first embodiment will be described. It is noted that in the following description, only the configuration in the vicinity of the stud bump formed to the semiconductor apparatus will be described. Other configurations can be manufactured by a well-known method of related art.

[Manufacturing Method: Subsequent UF Resin Process Flow]

Figure 6:
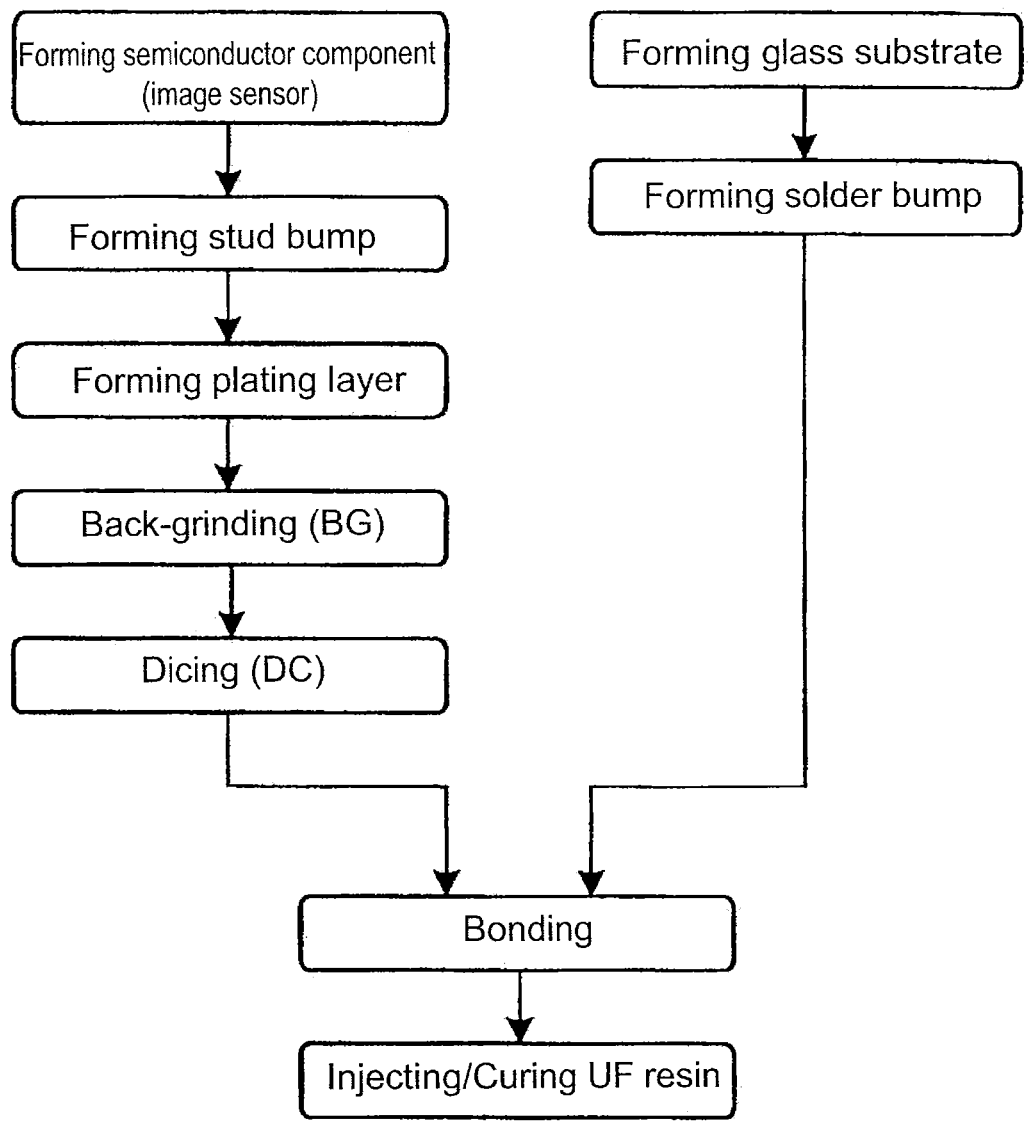
FIG. 6 is a drawing showing a process flow of the semiconductor apparatus according to the first embodiment.

FIG. 6 shows a process flow of the semiconductor apparatus 30 shown in FIG. 3.

As shown in FIG. 6, elements such as photodiodes and various kinds of transistors, and wirings and the like constituting the semiconductor component 31 on a semiconductor base are formed by the well-known method. At this time, the electrode 45 for external connection is formed for performing flip-chip connection.

The Cu stud bump 41 is formed on the electrode 45 for connecting to external devices of the semiconductor component 31.

The plating layer 42 is formed on the formed Cu stud bump 41 by an electroless plating method.

An opposite surface (rear surface) of a surface for forming various kinds of elements on the semiconductor base is cut (back-grinded: BG) and the semiconductor component 31 constituting a rear-surface irradiation type solid-state imaging device is formed.

The semiconductor base is subjected to dicing (DC) and the semiconductor component 31 is separated into individual chips.

Moreover, the wiring layer 34, the electrode 47 and the like are formed on the glass substrate 32 by the well-known method. Then, the UBM 48 is formed on the electrode 47.

The solder bump 44 is formed on the UBM 48 using the low melting point solder.

Next, the Cu stud bump 41 is brought into pressing contact with (bonded to) the solder bump 44, thereby flip-chip connecting the semiconductor component 31 which is separated into individual chips to the glass substrate 32. After connection, the under-fill (UF) resin 33 is injected around the connection portion between the Cu stud bump 41 and the solder bump 44. Then, the injected UF resin 33 is heated and the UF resin is hardened (cured).

With the above process, the semiconductor apparatus 30 can be manufactured.

[Manufacturing Method: Cu Stud Bump]

A Cu stud bump forming process in a process flow of the above described semiconductor apparatus 30 will be described with reference to a manufacturing process diagram shown in FIG. 7.

Figure 7A:
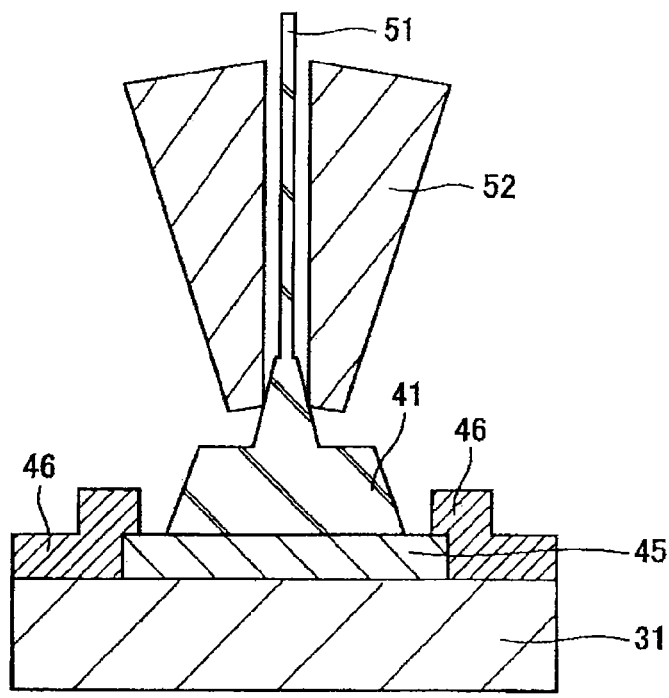
FIGS. 7A to 7C are manufacturing process diagrams of the Cu stud bump.
Figure 7B:
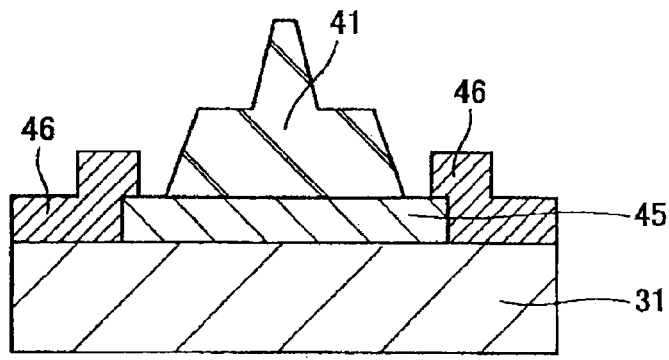

As shown in FIG. 7A, a Cu wire 51 is subjected to bonding on the electrode 45 of the semiconductor component 31 using a capillary 52. Then, as shown in FIG. 7B, the Cu stud bump 41 is formed by cutting the Cu wire 51. In a formation process of the Cu stud bump 41, for example, the Cu wire 51 having a diameter of 15 to 35 μmΦ is used to form the Cu stud bump 41 having a diameter of 30 to 70 μmΦ.

Figure 7C:
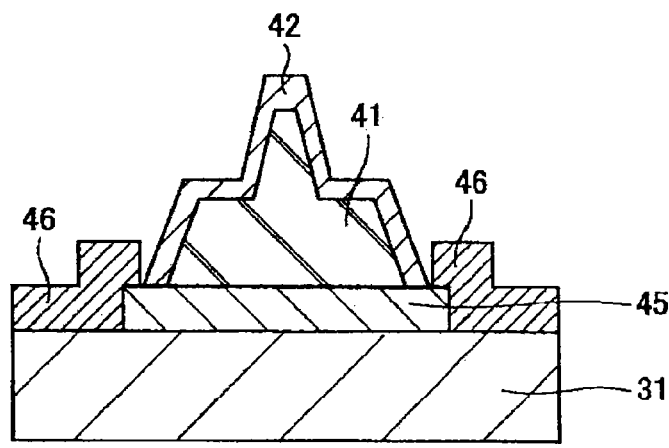

Next, as shown in FIG. 7C, the plating layer 42 is formed on a surface of the formed Cu stud bump 41. The plating layer 42 is formed by the electroless plating method. For example, a flash Ni plating is performed on the surface of the Cu stud bump 41 by the electroless plating method. Then, a flash Au plating is performed on the flash Ni plating layer. Thus, the plating layer 42 constituting the Ni plating layer and the Au plating layer is formed.

For example, in the plating layer 42, the Ni plating layer and the Au plating layer are formed to have a thickness of 0.01 to 0.1 μm, respectively.

Moreover, for example, Co plating is performed on the surface of the Cu stud bump 41 as the plating layer 42 by the electroless plating method. In this case, the plating layer 42 constituting the Co plating layer is formed to have a thickness of 0.01 to 0.1 μm.

With the above process, the Cu stud bump 41 is formed on the semiconductor component 31.

[Manufacturing Method: Solder Bump]

Next, a solder bump forming process in the process flow of the semiconductor apparatus 30 will be described with reference to a manufacturing process diagram shown in FIG. 8.

Figure 8A:
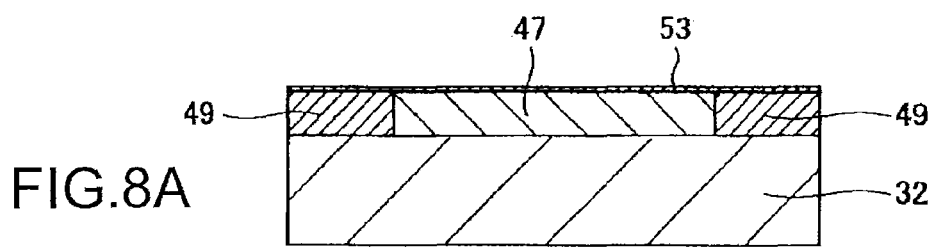
FIGS. 8A to 8D are manufacturing process diagrams of the solder bump.

As shown in FIG. 8A, a barrier metal layer 53 is formed on a surface of the electrode 47 and the protective layer 49.

Prior to forming the barrier metal layer 53, an oxide film on the surface of the electrode 47 is removed through reverse-sputtering. Subsequently, a Ti layer is formed on the electrode 47 by a sputtering method. Then, a Cu layer is formed so as to coat the Ti layer by the sputtering method. Thus, the barrier metal layer 53 constituted of the Ti layer and the Cu layer is formed.

Figure 8B:
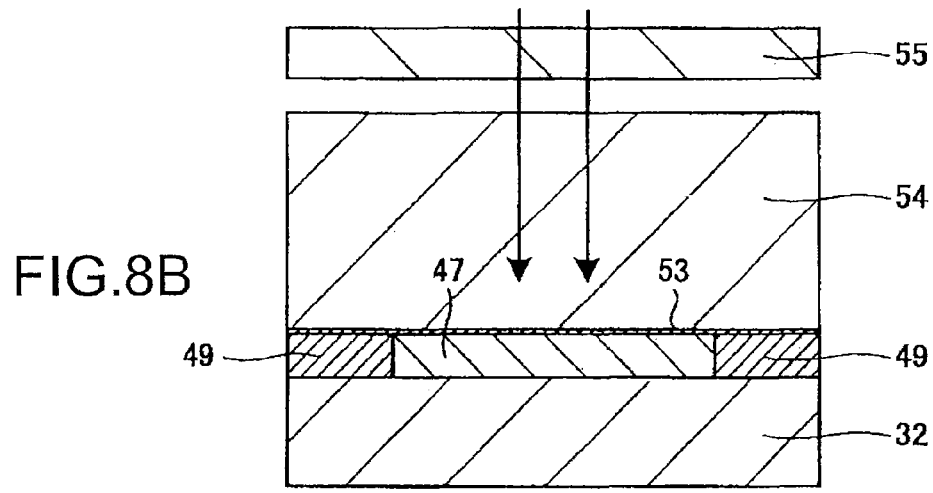

Next, as shown in FIG. 8B, a resist layer 54 is formed on the barrier metal layer 53. Then, the resist layer 54 is subjected to exposure processing by a photo mask 55. In the photo mask 55, a pattern for irradiating exposure light on a portion for forming the electrode 47 is used.

Figure 8C:
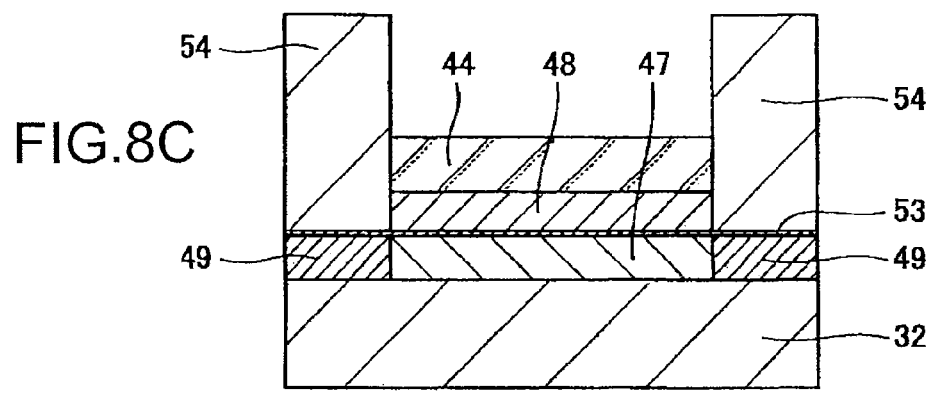

Next, as shown in FIG. 8C, the under bump metal (UBM) 48 and the solder bump 44 are formed in an opening formed by removing an exposure portion of the resist layer 54 by an electro plating method. The UBM 48 is formed by the electro plating method using Ni, Ti, TiW, W, Cu, and the like. Moreover, the solder bump 44 is formed by the electro plating method by use of a unary solder material of In, a low melting point binary solder material such as Sn—Bi, Sn—In, Bi—In, and the like.

Figure 8D:
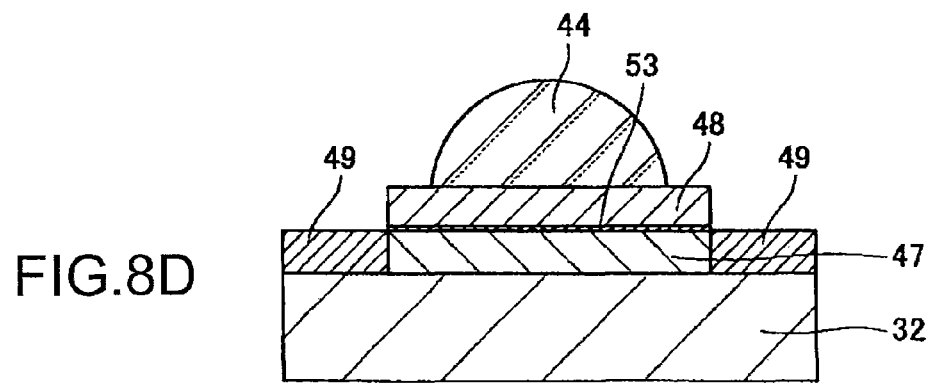

Next, as shown in FIG. 8D, after the resist layer 54 is removed, the barrier metal layer 53 exposed to the surface is removed. Further, the solder bump 44 is melted into a spherical form through a reflow.

With the above process, the solder bump 44 is formed on the glass substrate 32.

[Manufacturing Method: Flip-Chip Connection]

Next, a flip-chip connecting process and a UF resin sealing process in the process flow of the above described semiconductor apparatus 30 will be described with reference to a manufacturing process diagram shown in FIG. 9.

Figure 9A:
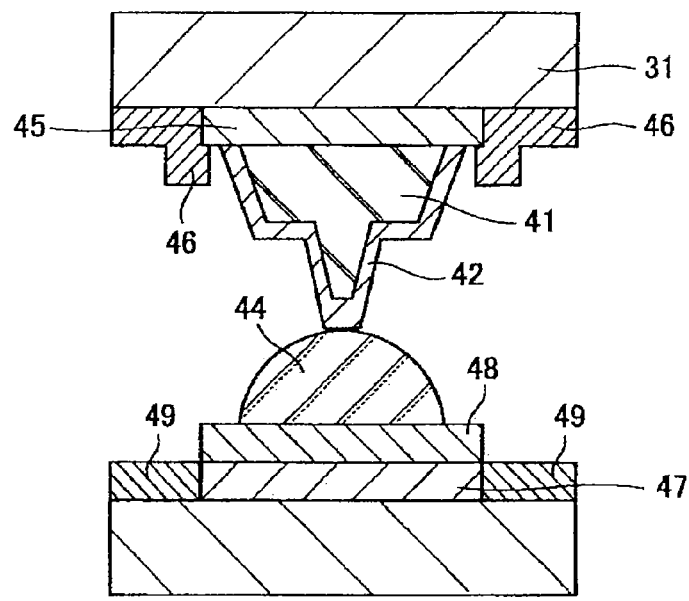
FIGS. 9A to 9C are process diagrams of the flip-chip connection by the Cu stud bump and the solder bump.

First, as shown in FIG. 9A, the semiconductor component 31 and the glass substrate 32 are aligned by facing a surface for forming the Cu stud bump 41 and a surface for forming the solder bump 44.

Figure 9B:
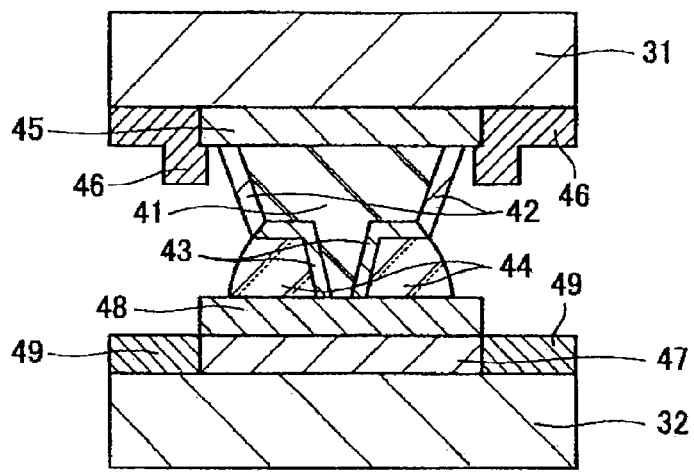

Next, as shown in FIG. 9B, while the Cu stud bump 41 and the solder bump 44 are aligned, the semiconductor component 31 and the glass substrate 32 are brought into pressing contact and are flip-chip connected. At this time, pressing contact and heating are simultaneously performed according to the flip-chip connection. The plating layer 42 on the surface of the Cu stud bump 41 is diffused into the solder bump 44 by thermal processing. Moreover, the alloy layer 43 is generated and grown on a connection surface between the Cu stud bump 41 and the solder bump 44 by thermal processing.

In the above described flip-chip connection, pressure (bonding force) applied to each unit of bump during pressing contact is 0.01 gf/bump to 10 gf/bump, for example. Moreover, a heating temperature is set at 200° C. or lower during the flip-chip connection. Moreover, the heating temperature is set at a temperature at or above a melting point of the solder bump 44 to be used. For example, in a case where a solder of solid In is used for the solder bump 44, the solder is heated at 156° C. or higher which is a melting point of In.

Figure 9C:
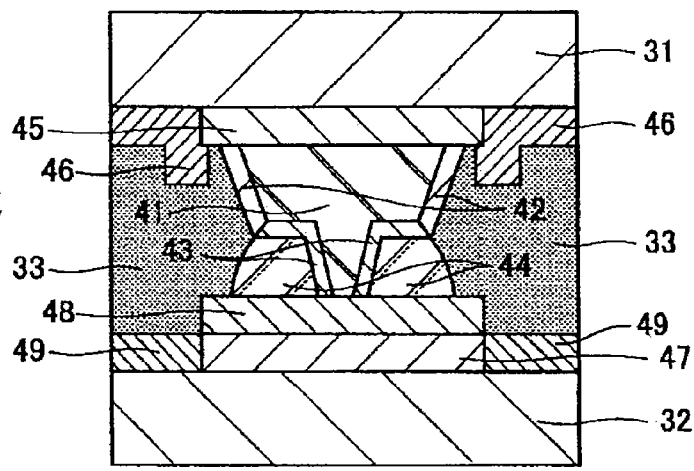

Next, as shown in FIG. 9C, the under-fill (UF) resin 33 is applied to the connection portion between the Cu stud bump 41 and the solder bump 44. Then, the UF resin 33 is heated and hardened. In the UF resin 33, the semiconductor component 31 and the glass substrate 32 are bonded, thereby improving mechanical connection reliability of an adhesive surface of the semiconductor apparatus.

With the above process, the semiconductor component 31 can be flip-chip connected to the glass substrate 32.

In the above described flip-chip connection, it is possible to perform a connection at 200° C. or lower by using the low melting point solder for the solder bump 44. Moreover, an alloy having a low strength is not generated by using the Cu stud bump 41 even in the low-temperature flip-chip connection.

It is noted that in the above mentioned manufacturing process, thermal processing for causing a growth of the alloy layer does not need to be performed at the same time as the flip-chip connection. For example, after the process for bringing into pressing contact with and flip-chip connecting the semiconductor component 31 and the glass substrate 32, annealing may be performed in a different process. At this time, the annealing is performed at 200° C. or lower.

[Modified Example: Preliminary UF Resin Process Flow]

Next, a modified example of a manufacturing method of the above described semiconductor apparatus 30 will be described. In the modified example, sealing flip-chip connection portion by the UF resin is different from the above described manufacturing method.

Figure 10:
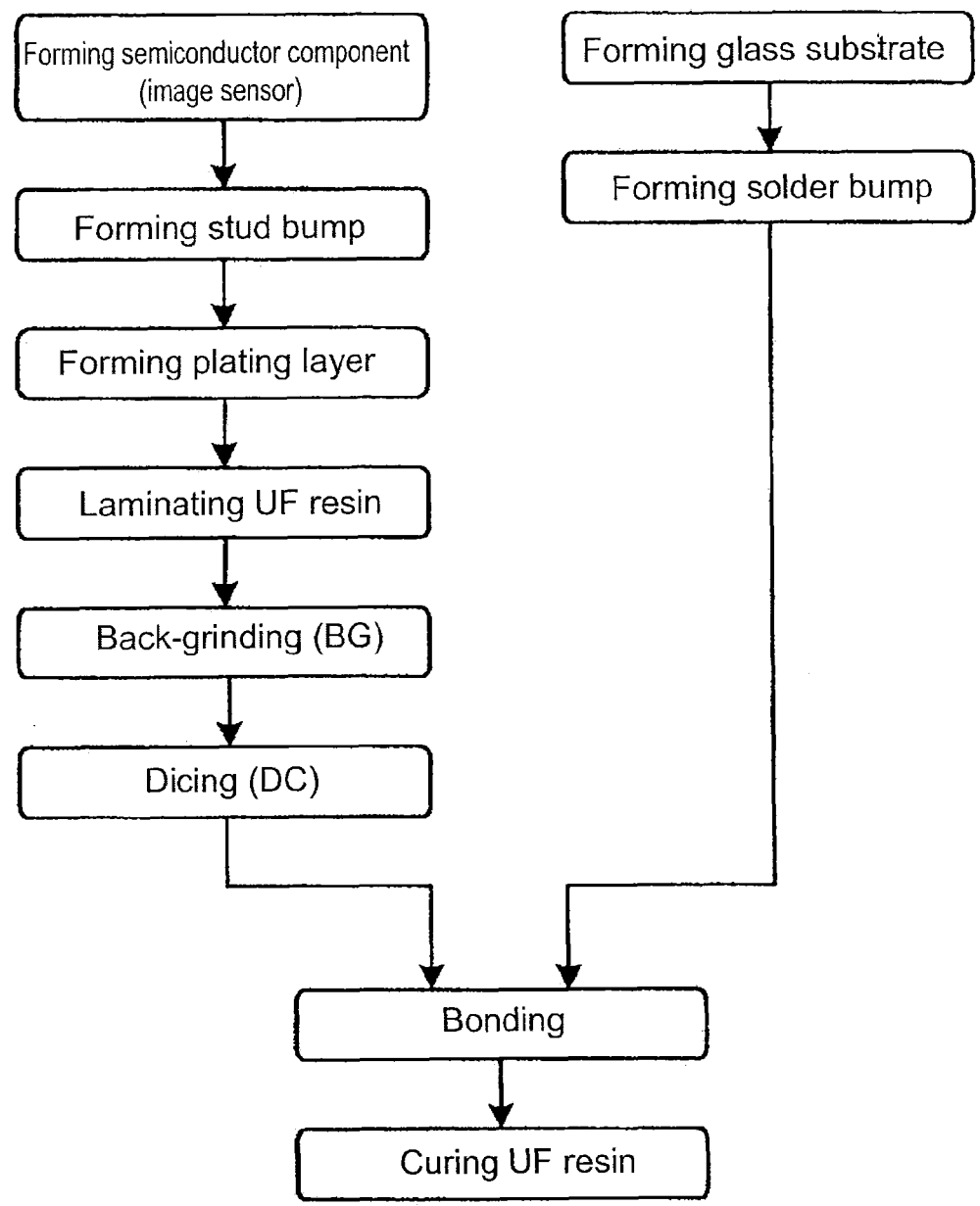
FIG. 10 is a drawing showing a modified example of the process flow of the semiconductor apparatus according to the first embodiment.

FIG. 10 shows a process flow which is changed in the UF resin sealing process.

As shown in FIG. 10, elements such as photodiodes and various kinds of transistors, and wirings and the like constituting the semiconductor component 31 on the semiconductor base are formed by the well-known method. At this time, the electrode 45 for external connection is formed for performing flip-chip connection.

The Cu stud bump 41 is formed on the electrode 45 for connecting to external devices of the semiconductor component.

The plating layer 42 is formed on the formed Cu stud bump 41 by the electroless plating method.

The under-fill (UF) resin 33 is laminated on the formed Cu stud bump 41.

An opposite surface (rear surface) of the surface for forming various kinds of elements on the semiconductor base is cut (back-grinded: BG) and the semiconductor component 31 constituting a rear-surface irradiation type solid-state imaging device is formed.

The semiconductor base is subjected to dicing (DC) and the semiconductor component 31 is separated into individual chips.

Moreover, the wiring layer 34, the electrode 47 and the like are formed on the glass substrate 32 by the well known method. Then, the UBM 48 is formed on the electrode 47.

The solder bump 44 is formed on the UBM 48 using the low melting point solder.

Next, the Cu stud bump 41 is brought into pressing contact with (bonded to) the solder bump 44, thereby flip-chip connecting the semiconductor component 31 which is separated into individual chips to the glass substrate 32. After connection, the OF resin 33 is heated and is hardened (cured).

With the above process, the semiconductor apparatus 30 can be manufactured.

Next, the UF resin forming process and the UF resin sealing process in the process flow of the above described semiconductor apparatus 30 will be described with reference to a manufacturing process diagram shown in FIG. 11. It is noted that in the following description, only the process which is different from the manufacturing method of the above described semiconductor apparatus will be described.

Figure 11A:
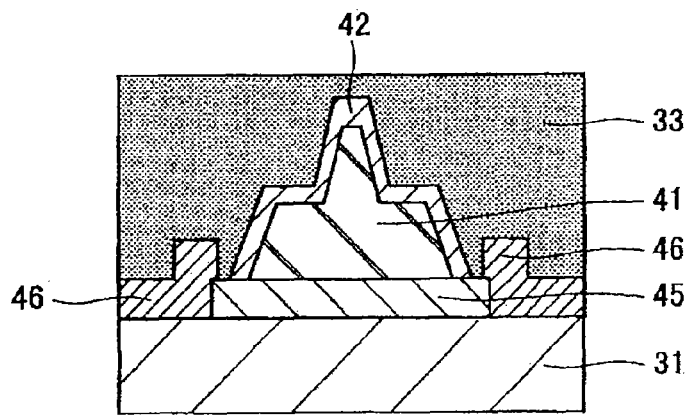
FIGS. 11A to 11C are process diagrams of the flip-chip connection by the Cu stud bump and the solder bump.

First, the plating layer 42 is formed on the Cu stud bump 41 by the above processes (FIG. 7C) and then the under-fill (UF) resin 33 covering the Cu stud bump 41 is formed as shown in FIG. 11A. The under-fill (UF) resin 33 is formed by a spin coating method using a coating liquid including the under-fill resin or a laminate of a dry film of the under-fill resin, for example.

Figure 11B:
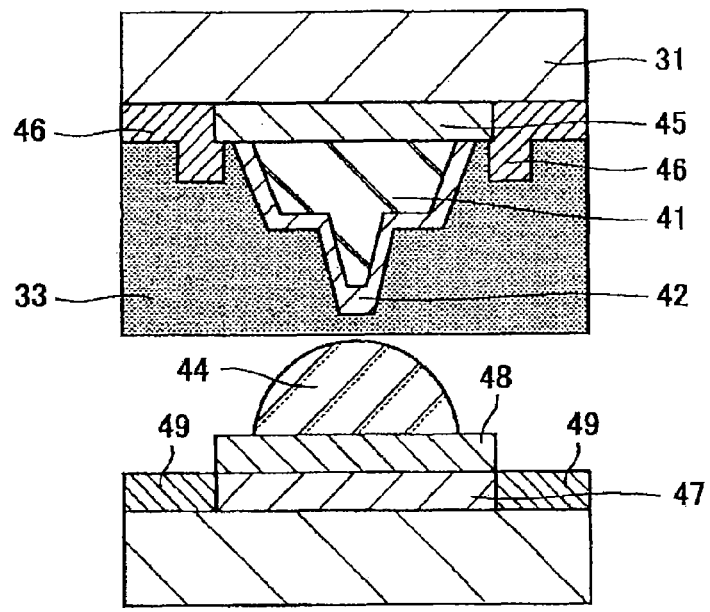
Figure 11C:
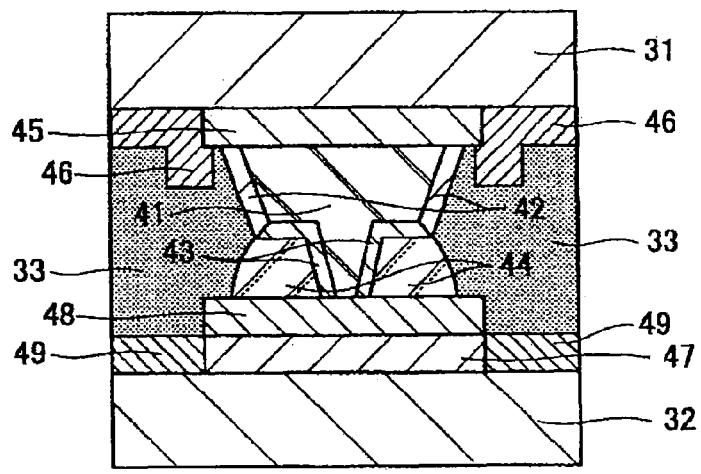

Next, as shown in FIG. 11B, the semiconductor component 31 and the glass substrate 32 are aligned by facing the surface for forming the Cu stud bump 41 and the surface for forming the solder bump 44. Then, as shown in FIG. 11C, the semiconductor component 31 and the glass substrate 32 are brought into pressing contact and are flip-chip connected. Further, the alloy layer 43 is grown on the connection surface between the Cu stud bump 41 and the solder bump 44, and the UF resin 33 is hardened by thermal processing.

With the above process, the UF resin 33 covering the Cu stud bump 41 is formed prior to the flip-chip connection and the semiconductor apparatus 30 can be manufactured by a method of hardening the UF resin 33 after the flip-chip connection.

[Modified Example of Semiconductor Apparatus]

Figure 12:
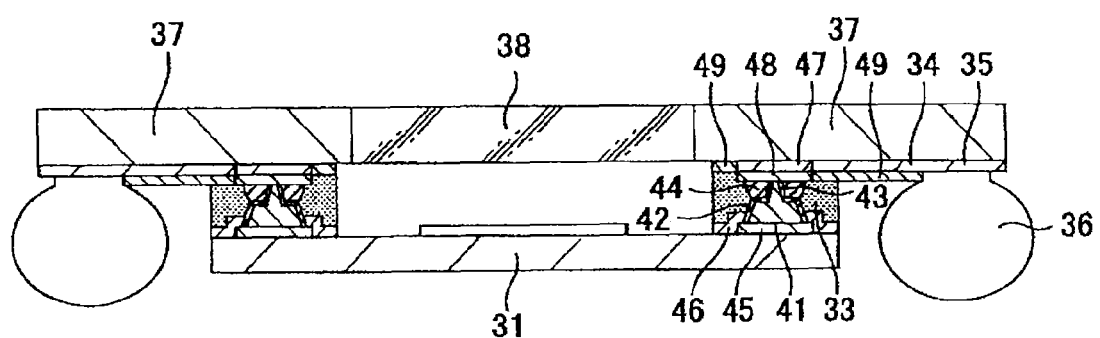
FIG. 12 is a drawing showing a configuration of a modified example of the semiconductor apparatus according to the first embodiment.

In the semiconductor apparatus of the first embodiment, the wiring substrate can be used instead of the glass substrate. FIG. 12 shows a configuration of the semiconductor apparatus which uses the wiring substrate.

The semiconductor apparatus shown in FIG. 12 is constituted of the semiconductor component 31 constituting the image sensor, and a wiring substrate 37. The semiconductor component 31 includes the electrode 45 formed on the semiconductor component 31 and the Cu stud bump 41 formed on the electrode 45.

Moreover, the wiring substrate 37 includes the electrode 47 for flip-chip connection formed on the wiring substrate 37, the under bump metal (UBM) 48 formed on the electrode 47, and the low melting point solder bump 44 formed on the UBM48. Further, the wiring substrate 37 includes the wiring layer 34 formed on the glass substrate 32, the protective layer 49 coating the wiring layer 34, the electrode 35 for external connection connected to the wiring layer 34, and the solder ball 36 formed on the electrode 35 for external connection.

For example, the wiring substrate 37 includes a translucent optical component 38 such as glass on the light receiving surface of the semiconductor component 31. Then, the electrode 47, the UBM 48, and the solder bump 44 are formed on the wiring substrate 37 along a circumference of the optical component 38.

It is noted that the configurations of the semiconductor component 31, the Cu stud bump 41 of the semiconductor component 31, and the like shown in FIG. 12 are the same as the first embodiment. Moreover, the configurations of the solder bump 44, the electrode 47, the wiring layer 34 and the like formed on the wiring substrate 37 are the same as the first embodiment.

As the modified example described above, a component to which the semiconductor component 31 including the Cu stud bump 41 is flip-chip connected is not particularly limited so long as an electronic component including an electrode corresponding to the flip-chip connection and the solder bump formed on the electrode is employed. The electronic component to which the semiconductor component is flip-chip connected may be the semiconductor element and the like besides the glass substrate and the wiring substrate which are described above, for example.

4. Second Embodiment of Semiconductor Apparatus

Figure 13:
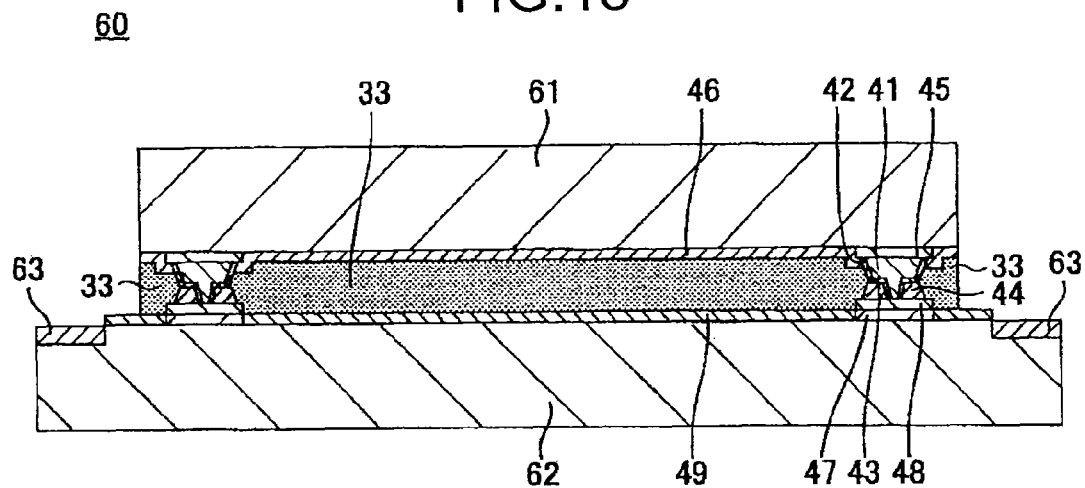
FIG. 13 is a cross-sectional view showing a configuration of a semiconductor apparatus according to a second embodiment.

Next, a second embodiment of the semiconductor apparatus will be described. FIG. 13 shows the semiconductor apparatus of the second embodiment.

A semiconductor apparatus 60 shown in FIG. 13 includes a first semiconductor component 61 and a second semiconductor component 62. Then, the first semiconductor component 61 is mounted on the second semiconductor component 62 by the flip-chip connection.

The first semiconductor component 61 includes the electrode 45 formed on the first semiconductor component 61 and the Cu stud bump 41 formed on the electrode 45. It is noted that the first semiconductor component 61 is the same configuration as the semiconductor component 31 of the first embodiment shown in FIG. 3 described above, so that the detailed description is omitted.

The second semiconductor component 62 includes the electrode 47 for flip-chip connection, the under bump metal (UBM) 48 formed on the electrode 47, and the low melting point solder bump 44 formed on the UBM48. Further, an end portion of the second semiconductor component 62 includes a pad electrode 63 for wire bonding for external connection. The semiconductor apparatus 60 is electrically connected by wire bonding to an external electronic apparatus by the pad electrode 63 for wire bonding of the second semiconductor component 62. Moreover, the protective layer 49 is provided on a surface of the second semiconductor component 62 except on the electrode 47 for flip-chip connection and the pad electrode 63 for wire bonding.

The surface of the Cu stud bump 41 is coated by the plating layer 42. As the plating layer 42, for example, the plating layer constituted of the flash Ni plating layer and the flash Au plating layer by the electroless method, or the electroless Co plating layer is used.

The solder bump 44 is formed of a low melting point solder. As the low melting point solder, the unary solder material of In, the low melting point binary solder material such as Sn—Bi, Sn—In, Bi—In, and the solder material formed by adding other metals to the binary solder material are used.

The alloy layer 43 of Cu and the solder is formed on the contact surface between the Cu stud bump 41 and the solder bump 44.

Moreover, in the semiconductor apparatus 60 shown in FIG. 13, the under-fill (UF) resin 33 which seals the entire connection surface between the semiconductor components is provided between the first semiconductor component 61 and the second semiconductor component 62. The first semiconductor component 61 and the second semiconductor component 62 are mechanically connected by the under-fill (UF) resin 33. Then, the connection portion between the Cu stud bump 41 and the solder bump 44 is formed into the under-fill (UF) resin 33. Thus, in the semiconductor apparatus 60, a fillet is formed by the under-fill resin 33 which fills between the first semiconductor component 61 and the second semiconductor component 62.

5. Method of Manufacturing Semiconductor Apparatus of Second Embodiment

[First Manufacturing Method: Subsequent UF Resin Process Flow]

Figure 14:
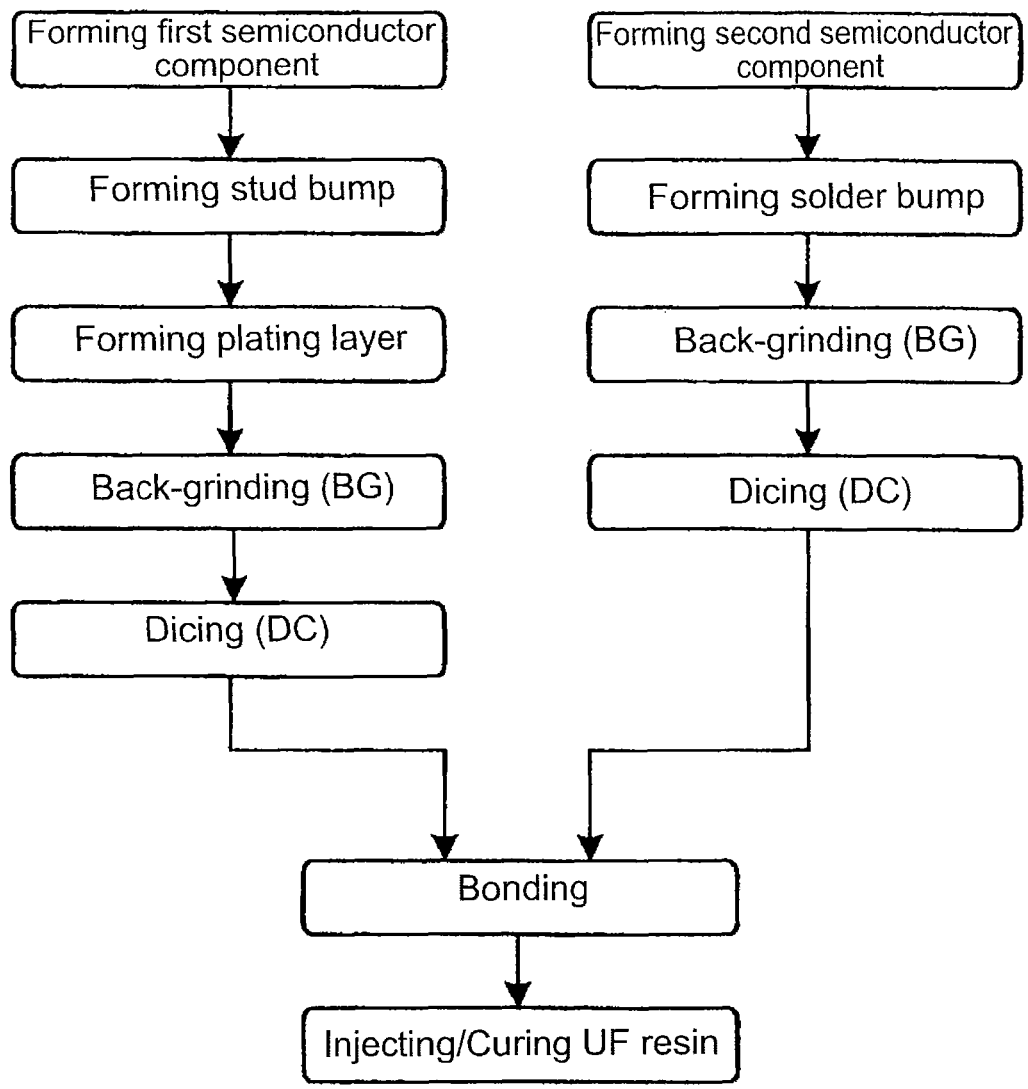
FIG. 14 is a drawing showing a process flow of the semiconductor apparatus according to a second embodiment.

FIG. 14 shows a process flow of the semiconductor apparatus 60 shown in FIG. 13.

As shown in FIG. 14, elements such as various kinds of transistors, and wirings and the like constituting the first semiconductor component 61 on the semiconductor base are formed by the well-known method. At this time, the electrode 45 for external connection is formed for performing flip-chip connection.

The Cu stud bump 41 is formed on the electrode for connecting to external devices of the first semiconductor component 61.

The plating layer 42 is formed on the formed Cu stud bump 41 by the electroless plating method.

The opposite surface (rear surface) of the surface for forming various kinds of elements on the semiconductor base is cut (back-grinded: BG). Then, the semiconductor base is subjected to dicing (DC) and the first semiconductor component 61 is separated into individual chips.

Moreover, elements such as various kinds of transistors, and wirings and the like constituting the second semiconductor component 62 on the semiconductor base are formed by the well-known method. At this time, the electrode 47 for mounting the first semiconductor component 61 is formed, and the UBM 48 is formed on the electrode 47.

The solder bump 44 is formed on the UBM 48 using the low melting point solder.

Then, the opposite surface (rear surface) of the surface for forming various kinds of elements on the semiconductor base is cut (back-grinded: BG). Then, the semiconductor base is subjected to dicing (DC) and the second semiconductor component 62 is separated into individual chips.

Next, the Cu stud bump 41 is brought into pressing contact with (bonded to) the solder bump 44, thereby flip-chip connecting the first semiconductor component 61 on the second semiconductor component 62.

After flip-chip connection, the connection portion between the Cu stud bump 41 and the solder bump 44 is covered and the under-fill (UF) resin 33 is injected between the first semiconductor component 61 and the second semiconductor component 62. Then, the injected UF resin 33 is heated and is hardened (cured).

With the above process, the semiconductor apparatus 60 of the second embodiment can be manufactured.

It is noted that formation of the Cu stud bump 41, formation of the solder bump 44, and the flip-chip connection can be performed by the same method as the first embodiment shown in FIGS. 7 to 9 described above.

[Second Manufacturing Method: Preliminary UF Resin Process Flow]

Next, a modified example of a manufacturing method of the semiconductor apparatus 60 of the second embodiment will be described. In the modified example, sealing both of the semiconductor components by the UF resin is different from the above described manufacturing method.

Figure 15:
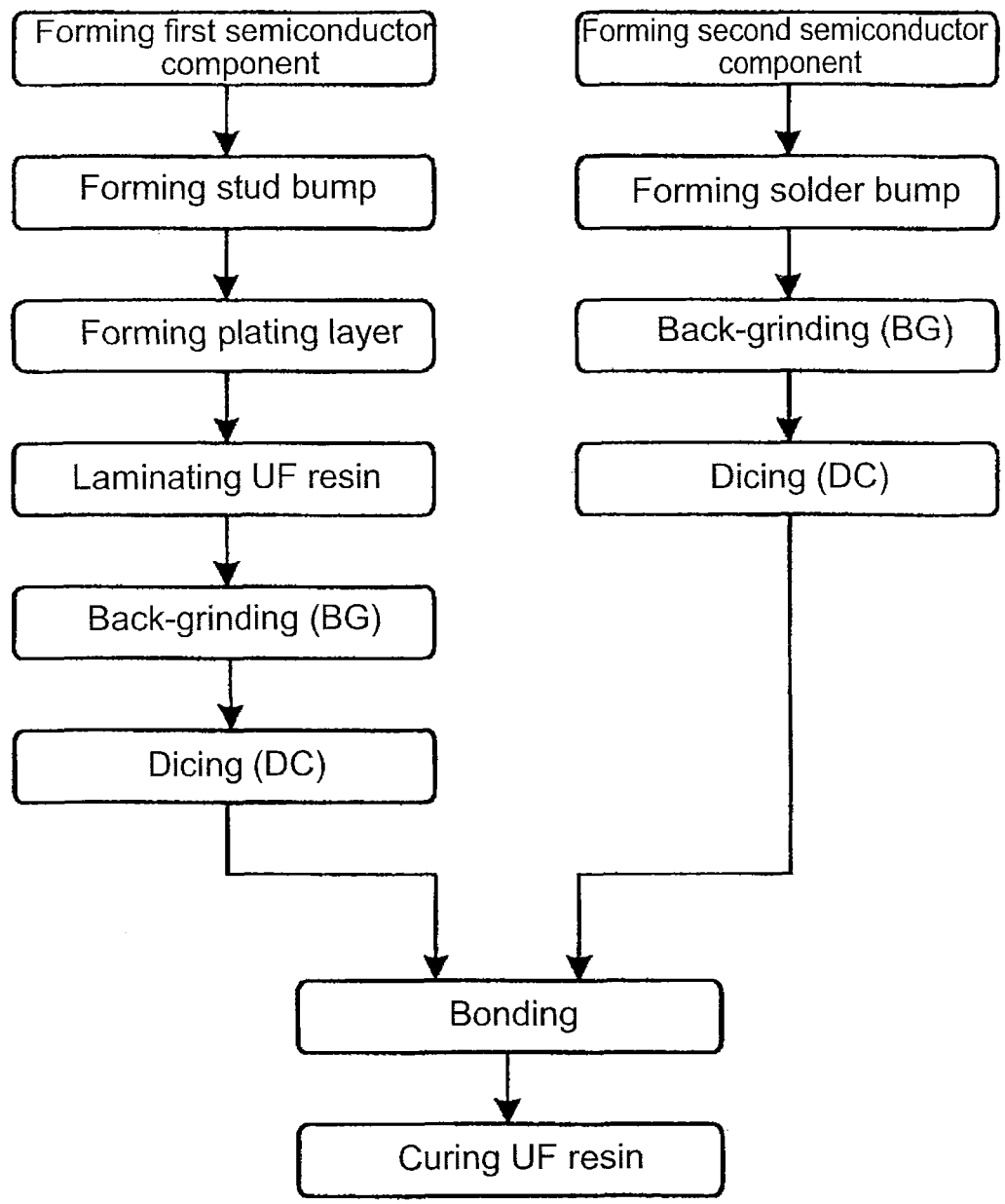
FIG. 15 is a drawing showing a modified example of the process flow of the semiconductor apparatus according to the second embodiment.

FIG. 15 shows a process flow which is changed in the UF resin sealing process.

As shown in FIG. 15, elements such as various kinds of transistors, and wirings and the like constituting the first semiconductor component 61 on the semiconductor base are formed by the well-known method. At this time, the electrode 45 for external connection is formed for performing flip-chip connection.

The Cu stud bump 41 is formed on the electrode for connecting to external devices of the first semiconductor component 61.

The plating layer 42 is formed on the formed Cu stud bump 41 by the electroless plating method.

The formed Cu stud bump 41 is covered and the under-fill (UF) resin 33 is laminated on the entire surface of the first semiconductor component 61.

The opposite surface (rear surface) of the surface for forming various kinds of elements on the semiconductor base is cut (back-grinded: BG). Then, the semiconductor base is subjected to dicing (DC) and the first semiconductor component 61 is separated into individual chips.

Moreover, elements such as various kinds of transistors, and wirings and the like constituting the second semiconductor component 62 on the semiconductor base are formed by the well-known method. At this time, the electrode 47 for mounting the first semiconductor component 61 is formed, and the UBM 48 is formed on the electrode 47.

The solder bump 44 is formed on the UBM 48 using the low melting point solder.

Then, the opposite surface (rear surface) of the surface for forming various kinds of elements on the semiconductor base is cut (back-grinded: BG). Then, the semiconductor base is subjected to dicing (DC) and the second semiconductor component 62 is separated into individual chips.

Next, the Cu stud bump 41 is brought into pressing contact with (bonded to) the solder bump 44, thereby flip-chip connecting the first semiconductor component 61 on the second semiconductor component 62. After connection, the injected UF resin is heated and is hardened.

With the above process, the semiconductor apparatus 60 of the second embodiment can be manufactured.

6. Electronic Apparatus

[Camera]

The semiconductor apparatus of the embodiments described above may be applied to electronic apparatuses including a semiconductor memory, a camera system such as a digital camera and a video camera, a mobile phone having an imaging function, or other devices having an image function, or the like. Hereinafter, the description will be made taking a camera as a configuration example of the electronic apparatus.

Figure 16:
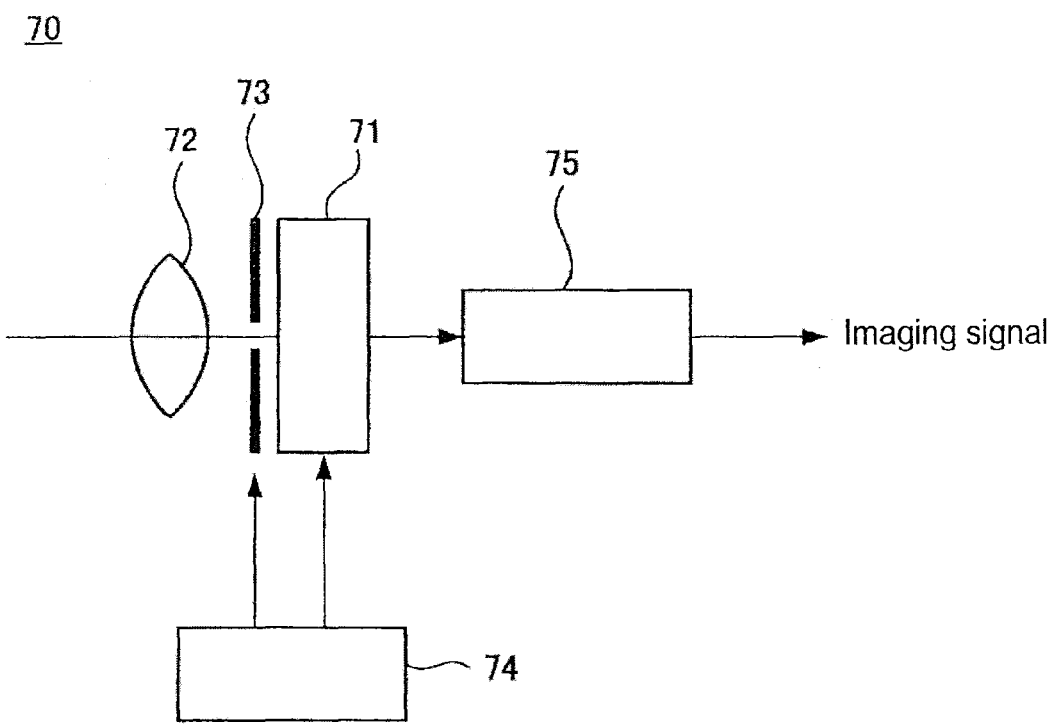
FIG. 16 is a drawing showing a configuration of an electronic apparatus.

FIG. 16 shows a configuration example of the video camera which is capable of taking a still image or a moving image.

A camera 70 of this example includes a solid-state imaging device 71, an optical system 72 which guides incident light to a light receiving sensor unit of the solid-state imaging device 71, a shutter device 73 provided between the solid-state imaging device 71 and the optical system 72, and a driving circuit 74 which drivers the solid-state imaging device 71. Further, the camera 70 includes a signal processing circuit 75 which processes an output signal of the solid-state imaging device 71.

The solid-state imaging device 71 is fabricated using semiconductor apparatus to which the solid-state imaging device including the above described Cu stud bump is flip-chip connected.

The optical system (optical lens) 72 focuses image light (incident light) from a subject on an imaging surface (not shown) of the solid-state imaging device 71. As a result, signal charges are accumulated in the solid-state imaging device 71 for a predetermined time period. It is noted that the optical system 72 may be constituted of an optical lens group including a plurality of optical lenses. Moreover, the shutter device 73 controls a light irradiation period and a light blocking time period to the solid-state imaging device 71 of the incident light.

The driving circuit 74 supplies a driving signal to the solid-state imaging device 71 and the shutter device 73. Then, the driving circuit 74 controls a signal output operation to the signal processing circuit 75 of the solid-state imaging device 71 and a shutter operation of the shutter device 73 by the supplied driving signal.

That is, in this example, based on the driving signal (timing signal) supplied from the driving circuit 74, the signal transmission operation is performed from the solid-state imaging device 71 to the signal processing circuit 75.

The signal processing circuit 75 performs various kinds of signal processing to the signal transmitted from the solid-state imaging device 71. Then, the signal (image signal) subjected to the various kinds of signal processing is stored in a storage medium (not shown) such as memory or output to a monitor (not shown).

It is noted that the present disclosure can be configured as follows.

(1) A semiconductor apparatus including: a semiconductor component; a Cu stud bump that is formed on the semiconductor component; and a solder bump configured to electrically connect to the Cu stud bump.

(2) The semiconductor apparatus according to Item (1), further including a plating layer that is formed on a surface of the Cu stud bump.

(3) The semiconductor apparatus according to Item (1) or (2), in which the solder bump contains at least one selected from In, SnBi, SnIn, and BiIn.

(4) The semiconductor apparatus according to Item (2) or (3), in which the plating layer includes one of a plating layer of Ni and Au and a Co plating layer.

(5) A method of manufacturing a semiconductor apparatus, including: forming a Cu stud bump on a semiconductor component; and flip-chip connecting the Cu stud bump to a solder bump.

(6) The method of manufacturing a semiconductor apparatus according to Item (5), further including forming a plating layer on a surface of the Cu stud bump by an electroless plating method.

(7) The method of manufacturing a semiconductor apparatus according to Item (5) or (6), in which heating is performed at 200° C. or lower one of during the flip-chip connecting and after the flip-chip connecting.

(8) An electronic apparatus, including: a semiconductor apparatus described in any one of Items (1) to (4), and a signal processing circuit configured to process an output signal of the semiconductor apparatus.

The present disclosure contains subject matter related to that disclosed in Japanese Priority Patent Application JP 2011-178390 filed in the Japan Patent Office on Aug. 17, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor apparatus, comprising:
    a substrate;
    a semiconductor circuit component separate from the substrate;
    a Cu stud bump that is formed on the semiconductor circuit component;
    a solder bump formed on the substrate and configured to electrically connect to the Cu stud bump;
    a plating layer that is formed directly on an outer surface of the Cu stud bump; and
    an alloy layer formed in between and immediately adjacent each of the Cu stud bump and the solder bump such that the alloy layer is in contact with each of the Cu stud bump and the solder bump,
    wherein the plating layer is formed directly on a portion of the outer surface of the Cu stud bump that is not brought in contact with the solder bump.

2. The semiconductor apparatus according to claim 1, wherein the solder bump contains at least one selected from In, SnBi, SnIn, and BiIn.

3. The semiconductor apparatus according to claim 1, wherein
    the plating layer includes one of a plating layer of Ni and Au and a Co plating layer.

4. An electronic apparatus, comprising:
    a semiconductor apparatus including a substrate, a semiconductor circuit component separate from the substrate, a Cu stud bump that is formed on the semiconductor circuit component, and a solder bump formed on the substrate and configured to electrically connect to the Cu stud bump;
    a signal processing circuit configured to process an output signal of the semiconductor apparatus;
    a plating layer that is formed directly on an outer surface of the Cu stud bump; and
    an alloy layer formed in between and immediately adjacent each of the Cu stud bump and the solder bump such that the alloy layer is in contact with each of the Cu stud bump and the solder bump,
    wherein the plating layer is formed directly on a portion of the outer surface of the Cu stud bump that is not brought in contact with the solder bump.

5. The semiconductor apparatus according to claim 1, further comprising:
    an electrode formed directly on the semiconductor circuit component,
    wherein the Cu stud bump is formed directly on the electrode.

* * * * *